(12) United States Patent
Kaneko

(10) Patent No.: US 6,911,673 B2
(45) Date of Patent: Jun. 28, 2005

(54) LIGHT EMITTING DIODE DEVICE

(75) Inventor: Kazuaki Kaneko, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/375,048

(22) Filed: Feb. 28, 2003

(65) Prior Publication Data

US 2003/0164504 A1 Sep. 4, 2003

(30) Foreign Application Priority Data

Mar. 1, 2002 (JP) .......................................... 2002-055675

(51) Int. Cl.$^7$ ............................................. H01L 27/15
(52) U.S. Cl. .............................. 257/81; 257/94; 257/99; 257/103
(58) Field of Search .................. 257/13, 79–82, 257/89, 93, 98, 99, 103, 918

(56) References Cited

U.S. PATENT DOCUMENTS

| | | | | |
|---|---|---|---|---|
| 5,214,306 A | * | 5/1993 | Hashimoto | 257/632 |
| 5,861,636 A | * | 1/1999 | Dutta et al. | 257/91 |
| 5,990,497 A | * | 11/1999 | Kamakura et al. | 257/94 |

FOREIGN PATENT DOCUMENTS

| | | |
|---|---|---|
| JP | 8-228023 | 9/1996 |
| JP | 9-30891 | 2/1997 |
| JP | 10-101475 | 4/1998 |
| JP | 11-12083 | 1/1999 |
| JP | 2000-72592 | 3/2000 |
| JP | 2000-114595 | 4/2000 |
| JP | 2001-114591 | 4/2001 |
| JP | 2002-158372 | 5/2002 |
| JP | 2002-231992 | 8/2002 |

* cited by examiner

*Primary Examiner*—Long Pham
*Assistant Examiner*—Wai-Sing Louie
(74) *Attorney, Agent, or Firm*—Morrison & Foerster LLP

(57) ABSTRACT

Light emitting diode (LED) device has a P-type GaAlAs cladding layer, a P-type GaAlAs active layer, an N-type GaAlAs cladding layer and a circular electrode formed in sequence on a P-type GaAs substrate and mesa etched. An area of a PN contact surface between the P-type active layer and the N-type cladding layer is between 0.053 mm$^2$ and 0.058 mm$^2$ which allows qualification criteria of the LED device for communications to be easily satisfied.

7 Claims, 2 Drawing Sheets

CHANGES OF OPTICAL OUTPUT AND RESPONSE CHARACTERISTIC WITH RESPECT TO CHANGE OF PN CONTACT AREA

CHANGES OF OPTICAL OUTPUT AND
RESPONSE CHARACTERISTIC WITH
RESPECT TO CHANGE OF PN CONTACT AREA

CHANGE OF OPTICAL OUTPUT WITH RESPECT
TO CHANGE IN THICKNESS OF P-TYPE ACTIVE LAYER

LIGHT EMITTING DIODE DEVICE

BACKGROUND OF THE INVENTION

The present invention relates to Light Emitting Diode (LED) devices.

Conventionally, LED devices made from GaAlAs (gallium-aluminum arsenide) have been manufactured as stated below. First, a P-type GaAlAs cladding layer, a P-type GaAlAs active layer and an N-type GaAlAs cladding layer are grown on a substrate by a liquid phase epitaxial growth method so as to form an epitaxial wafer. The epitaxial wafer is etched or lapped to obtain a specified thickness. After the wafer is cleaned and dried, an electrode material made of gold or Al is spattered on both the front and back surfaces of the wafer. Then, the surface of the waver i.e. the surface of an N-type GaAlAs cladding layer is coated with a resist and pre-hardened. A mask pattern is printed thereon and developed, so that a mask in a specified shape is formed. A portion of the electrode material not covered with the mask is etched off to form an electrode having a specified shape. After that, the mask is cleared off by an organic solvent cleaning, and the electrode etched into the specified shape is alloyed. Then, a PN contact surface formed to be a wafer, i.e., the contact surface between the P-type GaAlAs active layer and the N-type GaAlAs cladding layer, is segmented by mesa etching. The mesa etching is performed for manufacturing LED devices that are required relatively high reliability. The mesa etching is performed as follows First, a mask is formed on the surface of the wafer on which the alloyed electrode was provided. The formation of the mask is conducted by a method almost identical to the method for manufacturing the mask which is formed when the electrode is etched. Then, the wafer provided with the mask thereon is dipped in a mesa etchant, and etched up to the PN contact surface. Thereafter, the mask is removed. Next, a wafer test is conducted for measuring electric characteristics of each chip. As a result of the measurement, when a chip is disqualified, the chip is given marking as a defective chip. Then, the wafer is divided into chips by dicing, among which nondefective chips having no marking are collected as complete LED devices.

Thus-manufactured LED devices are used for displays and optical communications. When the LED devices are used in different applications such as displays and optical communications, acceptance criteria of electric characteristics of the LED devices are different in the wafer test. More particularly, in the case of LED devices for displays, only the lower limit criterion is specified on an optical output of the LED devices, whereas in the case of LED devices for optical communications both the upper and lower limit criteria are specified thereon. As for response characteristics, similarly, only the lower limit criterion is specified for the LED devices for displays, whereas both the upper and lower limit criteria are specified for the LED devices for optical communications.

However, when the conventional LED devices are used for optical communications, they have a problem of relatively high reject rate and low yield. This is because it is difficult to satisfy both the upper and lower limit criteria of the optical output and the response characteristics due to quality of internal luminous efficacy of the LED devices and dispersion of processing in a wafer process.

SUMMARY OF THE INVENTION

An object of the present invention is to provide an LED device manufacturable with a good yield and suitable for optical communications.

The present invention provides an LED device comprising:
 a semiconductor substrate;
 a first conductivity-type cladding layer on the semiconductor substrate;
 an active layer on the first conductivity-type cladding layer; and
 a second conductivity-type cladding layer on active layer, wherein
 an area of a contact surface between the active layer and the second conductivity-type cladding layer is 0.053 mm$^2$ or more and 0.058 mm$^2$ or less.

According to the above configuration, an area of a contact surface between the active layer and the second conductivity-type cladding layer is set to be 0.053 mm$^2$ or more and 0.058 mm$^2$ or less, so that specified criteria of both the optical output and the response characteristics are satisfied. This enables easy manufacturing of the LED device suitable for optical communications with a good yield. When an area of the contact surface is smaller than 0.053 mm$^2$, the optical output falls below the lower limit of the criterion. When an area of the contact surface is larger than 0.058 mm$^2$, the response characteristics fall below the lower limit of the criterion.

In one embodiment of the present invention, the second conductivity-type cladding layer has a thickness of 10 $\mu$m or more and 22 $\mu$m or less.

According to the above embodiment, the second conductivity-type cladding layer is set to have a thickness of 10 $\mu$m or more and 22 $\mu$m or less to decrease dispersion of the optical output. When the second conductivity-type cladding layer has a thickness of less than 10 $\mu$m, less current spreads toward the active layer via the second conductivity-type cladding layer, and therefore the optical output is decreased. When the second conductivity-type cladding layer has a thickness of more than 22 $\mu$m, a depth from the surface of a PN contact portion is decreased, which disables adjustment of the contact surface area of the PN contact portion by, for example, mesa etching in the manufacturing process of the LED device.

In one embodiment of the present invention, the active layer has a thickness of 4 $\mu$m or more and 6 $\mu$m or less.

According to the above embodiment, the active layer has a thickness of 4 $\mu$m or more and 6 $\mu$m or less In this thickness range of the active layer, the optical output is almost unchanged, so that the LED device with a specified optical output may be easily formed. When the active layer has a thickness of less than 4 $\mu$m, a ratio of change in the optical output to change in the thickness of the active layer increases, which generates larger dispersion of light intensity of the LED device per product. When the active layer has a thickness of more than 6 $\mu$m, a shortage of the optical output occurs.

In one embodiment of the present invention, mesa etching is conducted up to 50 $\mu$m to 70 $\mu$m in depth from a periphery of an upper surface of the second conductivity-type cladding layer.

According to the above embodiment, mesa etching is applied to the LED device in a range of 50 $\mu$m to 70 $\mu$m in depth from the periphery of the upper surface of the second conductivity-type cladding layer, so that a PN contact surface has a proper cross sectional area. When a depth of the mesa etching is smaller than 50 $\mu$m, it becomes impossible to adjust a cross sectional area of the surface of forming the PN contact. When a depth of the mesa etching is larger than 70 $\mu$m, a cross sectional area of the surface of forming the PN contact is decreased, which makes it impossible to obtain a proper optical output.

In one embodiment of the present invention, an electrode having a circular shape with a diameter of 180 μm or more and 220 μm or less is provided on a surface of the second conductivity-type cladding layer.

According to the above embodiment, there is provided an electrode having an approximately circular shape on a plane, and a diameter of the electrode is set to 180 μm or more and 220 μm or less, so as to provide the LED device with a proper optical output. When a diameter of the electrode is smaller than 180 μm, the optical output becomes too large and exceeds the upper limit of the criterion. When a diameter of the electrode is larger than 220 μm, the diameter approximates to a size of the surface of the second conductivity-type cladding layer. Consequently, in the case where the electrode is formed in a slightly displaced position, an end portion of the electrode is likely to protrude from an end portion of the surface of the second conductivity-type cladding layer, and the protruded end portion of the electrode may come into contact with the PN contact portion, thereby causing such disadvantage as generation of leakage current.

In one embodiment of the present invention, the semiconductor substrate is made of P-type GaAs, the first conductivity-type cladding layer is made of P-type or N-type GaAlAs, the active layer is made of P-type GaAlAs and the second conductivity-type cladding layer is made of N-type or P-type GaAlAs.

According to the above embodiment, by using materials that have been widely used in the past, the LED devices suitable for, for example, optical communications may be easily and inexpensively manufactured with a high yield.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention will be described in detail in conjunction with embodiment with reference to accompanying drawings.

Figure 1:
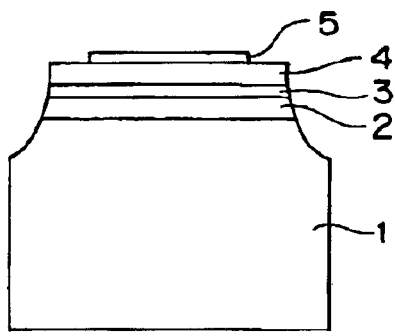
FIG. 1 is a view showing an LED device according to an embodiment of the present invention.

FIG. 1 is a view showing an LED device according to an embodiment of the present invention. The LED device is composed of a P-type GaAlAs cladding layer 2, a P-type GaAlAs active layer 3 and an N-type GaAlAs cladding layer 4 formed in sequence on a P-type GaAs substrate 1. Beneath the lower surface of the P-type GaAs substrate 1, there is provided an unshown P-side electrode, while on the surface of the N-type GaAlAs cladding layer 4, there is provided an plane N-side electrode 5 having an approximately circular shape. On both sides of the LED device in the width direction, mesa etching is applied to forms a mesa shape extending from the surface of the N-type cladding layer 4, the P-type active layer 3, the P-type cladding layer 2 and to the upper part of the P-type substrate 1. A PN contact surface, which is a contact surface between the P-type active layer 3 and the N-type cladding layer 4, is formed to have an area of 0.053 mm$^2$ or more and 0.058 mm$^2$ or less.

The LED device is manufactured as described below. First, by a slide boat method using three Ga melts with different compositions, there is conducted liquid phase epitaxial growth of a P-type GaAlAs cladding layer 2, a P-type GaAlAs active layer 3 and an N-type GaAlAs cladding layer 4 in sequence on a P-type GaAs substrate 1. More particularly, a supercooling degree is set to approximately. 50° C., and thereafter, a first Ga melt having an adding ratio of Al to Ga equal to around 0.19 wt % or more and 0.25 wt % or less is put on the P-type substrate 1. Then, epitaxial growth is started at a temperature of 800° C. or more and 805° C. or less. A temperature difference in growing process is set to 5° C. or more and 10° C. or less. Here, the P-type GaAlAs cladding layer 2 is grown at a cooling speed of 0.6° C./min or more and 1.0° C./min or less. Then, the first Ga melt is removed from the top of the wafer. Next, a second Ga melt is placed, and then epitaxial growth is started at a temperature of 794.6° C. or more and 794.8° C. or less. A temperature difference in growing process is set to 0.4° C. or more and 0.5° C. or less. Here, the P-type GaAlAs cladding layer 3 is grown at a cooling speed of 0.02° C./min or more and 0.04° C./min or less. Then, the second Ga melt is removed from the top of the wafer. Next, a third Ga melt is placed, and then epitaxial growth is started at a temperature of 794.1° C. or more and 794.4° C. or less. A temperature difference in growing process is set to 80° C. or more and 100° C. or less. Here, the N-type GaAlAs cladding layer 4 is grown at a cooling speed of 0.6° C./min or more and 1.0° C./min or less. Then, the third Ga melt is removed from the top of the wafer. When the epitaxial growth is conducted with use of the first to the third Ga melts, the wafer is rotated so as to keep constant an atmosphere that comes into contact with the surface of the wafer.

As described above, on the P-type GaAs substrate 1, there are formed the P-type GaAlAs cladding layer 2 having a thickness of 10 μm or more and 40 μm or less and having a mixing ratio of Al being 0.65, the P-type GaAlAs active layer 3 having a thickness of 4 μm or more and 6 μm or less, and the N-type GaAlAs cladding layer 4 having a thickness of 10 μm or more and 22 μm or less. In the case where the N-type GaAlAs cladding layer 4 has a film thickness of 22 μm or more, a portion of the cladding layer 4 corresponding to a specified thickness is etched off to regulate the thickness.

On the surface of the N-type GaAlAs cladding layer 4 thus-formed on the wafer by epitaxial growth, there is formed an approximately circular-shaped electrode 5 with a diameter of 180 μm or more and 220 μm or less by using the same etching technique as the conventional one. Next, on the surface of the wafer on which the electrode 5 is formed, there is formed a mask in a specified shape with use of a photo resist Then, the wafer with the mask formed thereof is dipped in a mesa etchant, and etched up to a PN contact portion that is the contact portion between the P-type active layer 3 and the N-type cladding layer 4. The etching is preferably conducted to reach 50 μm to 70 μm in depth from the surface of the wafer. Consequently, the PN contact portion may be credibly segmented per chip. After that, the mask is removed, and a wafer test is conducted to measure electric characteristics of each chip. A measurement result of the electric characteristics is compared with pre-determined criteria. The chips whose measurement results do not meet the criteria are marked as defective chips. After the wafer test, the wafer is diced to divide into. The chips other than marked ones are collected as complete LED devices of the present embodiment.

Figure 2:
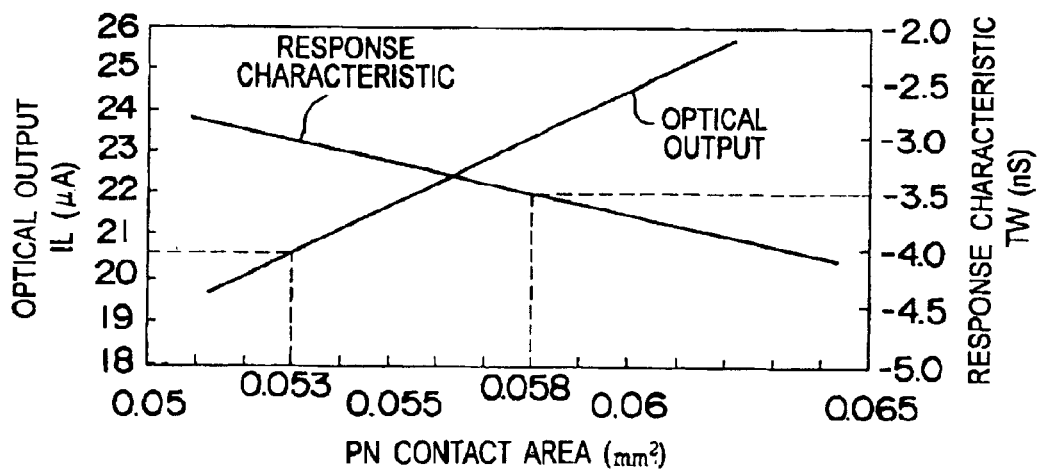
FIG. 2 is a view showing the state where an optical output IL and response characteristics Tw of the LED device of FIG. 1 is changed when a PN contact area of the LED device is changed.
Figure 3:
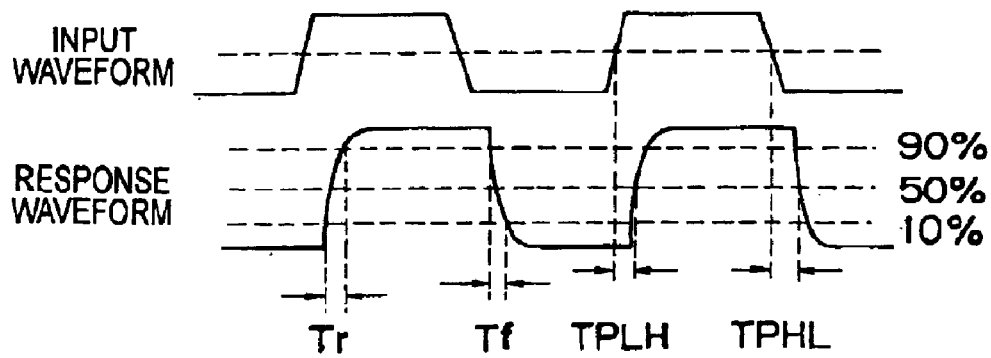
FIG. 3 is a view showing an input waveform of a current applied to the LED device and a response waveform of an optical output in response thereto.

FIG. 2 is a view showing the states where an optical output IL and response characteristics Tw of the LED device according to the present embodiment are changed when a PN contact area of the LED device is changed. In FIG. 2, a horizontal axis denotes a PN contact area (mm$^2$), whereas a vertical axis on the left side represents an optical output IL ($\mu$A), and a vertical axis on the right side represents response characteristics Tw (ns). The response characteristics Tw is a value calculated by subtracting falling edge delay time TPHL from rising edge delay time TPLH in a response waveform of an optical output when a current having a pulse-type input waveform is applied to the LED device. As shown in FIG. 3, in the process of increasing a current value applied to the LED device, the rising edge delay time TPLH is a time difference between a point of time when the current reaches 50% of a maximum value and a point of time when an optical output value increased by increase of the applied current reaches 50% of a maximum value. In the process of decreasing a current value applied to the LED, the falling edge delay time TPHL is a time difference between a point of time when the current reaches 50% of the maximum value and a point of time when the optical output value decreased by decrease of the applied current reaches 50% of the maximum value. In the case where the LED device is applied to optical communications, it is preferable that a difference between the rising edge delay time TPLH and the falling edge delay time TPHL approximates to 0, that is, the response characteristics TW approximate to 0. The response characteristics TW decreases as the PN contact area decreases.

Decrease of the response characteristics TW in conjunction with decrease in the PN contact area relates to capacity of the LED device. When the PN contact area decreases, the capacity of the LED device also decreases. This shortens the time taken for charging the LED device when a pulse current is applied, as a result of which the rising edge delay time TPLH is reduced. The falling edge delay time TPHL is sufficiently smaller than the rising edge delay time TPLH by nature, and therefore the effect of time reduction on the decrease in the PN contact area is remarkably smaller than that in the case of the rising edge delay time TPLH. Therefore, decrease in the PN contact area scarcely reduces the falling edge delay time TPHL. More specifically, decrease of the response characteristics TW due to decrease in the PN contact area is mainly achieved by reduction of the rising edge delay time TPLH.

Table 1 shown below is a table showing the rising edge delay time TPLH, the falling edge delay time TPHL, the response characteristics TW, the capacity and the optical output of the LED device with regard to a plurality of PN contact areas different from each other.

TABLE 1

| PN contact area (mm$^2$) | Delay time and response characteristics | | | Capacity (pF) | Optical output ($\mu$A) |
|---|---|---|---|---|---|
| | TPLH (ns) | TPHL (ns) | Tw (ns) | | |
| 0.0527 | 21.49 | 18.48 | −3.01 | 46.96 | 20.52 |
| 0.0533 | 21.63 | 18.58 | −3.05 | 48.74 | 20.82 |
| 0.0579 | 22.19 | 18.64 | −3.54 | 53.44 | 23.86 |
| 0.0611 | 23.61 | 18.48 | −3.77 | 54.34 | 25.02 |

In the case where the LED device is used as a light source in optical transmission for audio equipment, the response characteristics TW are preferably −3.6 ns or more and 5.0 ns or less. Table 1 and FIG. 2 indicate that the PN contact area necessary for obtaining the response characteristics TW is 0.058 mm$^2$ or less.

Decrease in the PN contact area reduces an emission region, and thereby an optical output of the LED device is decreased. In the case where the LED device is used as a light source in optical transmission for audio equipment, the optical output is preferably 20 $\mu$m or more and 26 $\mu$A or less. Table 1 and FIG. 2 indicate that the PN contact area necessary for obtaining the optical output is 0.053 mm$^2$ or more.

Therefore, the LED device is capable of satisfying the qualifying criteria of an optical output and response characteristics by setting a PN contact area to 0.053 mm$^2$ or more and 0.058 mm$^2$ or less. In other words, appropriate control of a PN contact area enables easy manufacturing of an LED device suitable for optical communications with a good yield.

Further, since the N-type GaAlAs cladding layer 4 has a thickness of 10 $\mu$m or more and 22 $\mu$m or less, it becomes possible to appropriately spread the current toward the active layer 3 via the N-type GaAlAs cladding layer 4, by which an appropriate optical output value is obtainable. Also, a depth from the surface of the PN contact may be appropriately set, which ensures segmentation of the PN contact by etching in manufacturing the LED device, and thereby makes it possible to set an appropriate value for the PN contact area per chip.

Also, since the P-type GaAlAs active layer 3 is set to have a thickness of 4 $\mu$m or more and 6 $\mu$m or less, it becomes possible to stably set a specified value as an optical output of the LED device.

Figure 4:
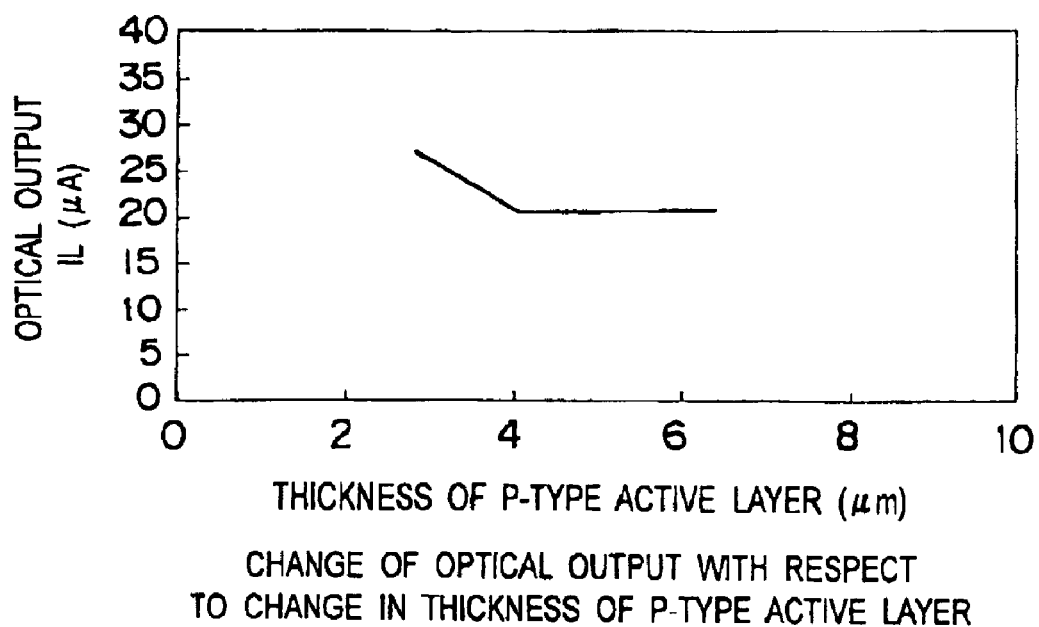
FIG. 4 is a view showing the state where an optical output IL of the LED device of FIG. 1 is changed when a thickness of a P-type GaAlAs active layer 3 of the LED device is changed.

FIG. 4 is a view showing a change of an optical output IL in the LED device when a thickness of a P-type GaAlAs active layer 3 is changed. In FIG. 4, a horizontal axis represents a thickness ($\mu$m) of the P-type GaAlAs active layer 3, whereas a vertical axis represents an optical output IL ($\mu$A) of the LED device. As shown in FIG. 4, when a thickness of the P-type GaAlAs active layer 3 is 4 υm or more and 6 $\mu$m or less, the optical output IL of the LED device hardly changes in approximately 20 $\mu$A. Therefore, the optical output IL of the LED device is stably set to approximately 20 $\mu$A by setting the thickness of the P-type GaAlAs active layer 3 to 4 $\mu$m or more and 6 $\mu$m or less. Thereby, dispersion of the optical output may be reduced. As a result, relatively easy formation of the P-type GaAlAs active layer 3 is achieved without a necessity of managing the thickness with high accuracy. Therefore, the LED device which satisfies a specified optical output criterion and which is suitable for optical communications may be manufactured with a high yield.

In the above embodiment, there are provided a P-type cladding layer, an active layer and an N-type cladding layer in sequence on a semiconductor substrate. However, the conductivity type of the cladding layers may be contrary to each other while the active layer is interposed therebetween. More specifically, the cladding layer nearer to the semiconductor substrate than the active layer may be of N type and the cladding layer farther from the semiconductor substrate than the active layer may be of P type.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. An LED device comprising:
  a semiconductor substrate;
  a first conductivity-type cladding layer on the semiconductor substrate;
  an active layer on the first conductivity-type cladding layer; and
  a second conductivity-type cladding layer on active layer, wherein
  an area of a contact surface between the active layer and the second conductivity-type cladding layer is greater than or equal to 0.053 mm$^2$ and less than or equal to 0.058 mm$^2$.

2. The LED device as defined in claim 1, wherein
  the second conductivity-type cladding layer has a thickness which is greater than or equal to 10 μm and less than or equal to 22 μm.

3. The LED device as defined in claim 1, wherein
  the active layer has a thickness which is greater than or equal to 4 μm and less than or equal to 6 μm.

4. The LED device as defined in claim 1, wherein
  mesa etching is conducted from 50 μm to 70 μm in depth from a periphery of an upper surface of the second conductivity-type cladding layer.

5. The LED device as defined in claim 1, wherein
  an electrode having a circular shape with a diameter of greater than or equal to 180 μm and less than or equal to 200 μm is provided on a surface of the second conductivity-type cladding layer.

6. The LED device as defined in claim 1, wherein
  the semiconductor substrate is made of P-type GaAs, the first conductivity-type cladding layer is made of P-type GaAlAs, the active layer is made of P-type GaAlAs and the second conductivity-type cladding layer is made of N-type GaAlAs.

7. The LED device as defined in claim 1, wherein
  the semiconductor substrate is made of P-type GaAs, the first conductivity-type cladding layer is made of N-type GaAlAs, the active layer is made of P-type GaAlAs and the second conductivity-type cladding layer is made of P-type GaAlAs.

* * * * *